United States Patent
Rittner

(10) Patent No.: US 7,789,573 B2
(45) Date of Patent: Sep. 7, 2010

(54) OPTOELECTRONIC MODULE

(75) Inventor: Roland Rittner, Herbrechtingen (DE)

(73) Assignee: OSRAM Gesellschaft mit beschrankter Haftung, Munich (DE)

(*) Notice: Subject to any disclaimer, the term of this patent is extended or adjusted under 35 U.S.C. 154(b) by 95 days.

(21) Appl. No.: 11/890,944

(22) Filed: Aug. 6, 2007

(65) Prior Publication Data
US 2008/0031575 A1 Feb. 7, 2008

(30) Foreign Application Priority Data
Aug. 4, 2006 (DE) .............. 10 2006 036 544

(51) Int. Cl.
G02B 6/36 (2006.01)

(52) U.S. Cl. .......... 385/88; 257/432; 257/459; 257/693

(58) Field of Classification Search .......... 385/88–94
See application file for complete search history.

(56) References Cited

U.S. PATENT DOCUMENTS

| 4,355,321 | A | * | 10/1982 | Yeats | .......... 257/434 |
| 5,872,405 | A | | 2/1999 | Evers | |
| 6,392,778 | B1 | | 5/2002 | Perduijn et al. | |
| 6,428,189 | B1 | * | 8/2002 | Hochstein | .......... 362/373 |
| 6,575,611 | B2 | | 6/2003 | Kugler et al. | |
| 7,125,143 | B2 | | 10/2006 | Hacker | |
| 2004/0190294 | A1 | | 9/2004 | Gasquet et al. | |
| 2004/0266058 | A1 | * | 12/2004 | Lee et al. | .......... 438/106 |

FOREIGN PATENT DOCUMENTS

| DE | 200 07 730 | 8/2000 |
| DE | 10 35 077 | 3/2005 |
| DE | 10 2004 045 947 | 1/2006 |
| EP | 0 400 476 | 5/1990 |
| EP | 0 896 898 | 7/1998 |
| EP | 1 031 396 | 2/2000 |
| GB | 2 361 581 | 10/2001 |
| JP | 4-162641 | 6/1992 |
| JP | 2001-148403 | 5/2001 |
| WO | WO 2006/002603 A2 | 1/2006 |

OTHER PUBLICATIONS

Whitehead et al., "Soldering with light!", Assembly Automation, vol. 15 No. 1995, pp. 17-19.*
Dr. Hans Bell et al., "Temperature profiles for reflow soldering", rehm Anlagenbau GmbH, EPP issue, pp. 1-12, Jun. 2003.

* cited by examiner

Primary Examiner—Sarah Song
(74) Attorney, Agent, or Firm—Cohen Pontani Lieberman & Pavane LLP

(57) ABSTRACT

An optoelectronic module having an optoelectronic device with a contact conductor and a connection carrier with a connection area. The contact conductor is electrically conductively and/or thermally conductively connected to the connection area. A local, delimited heating region is formed on the contact conductor or the connection carrier has a cut-out, which is at least partly covered by the contact conductor. A method which enables simplified and reliable production of an optoelectronic module is also described.

38 Claims, 7 Drawing Sheets

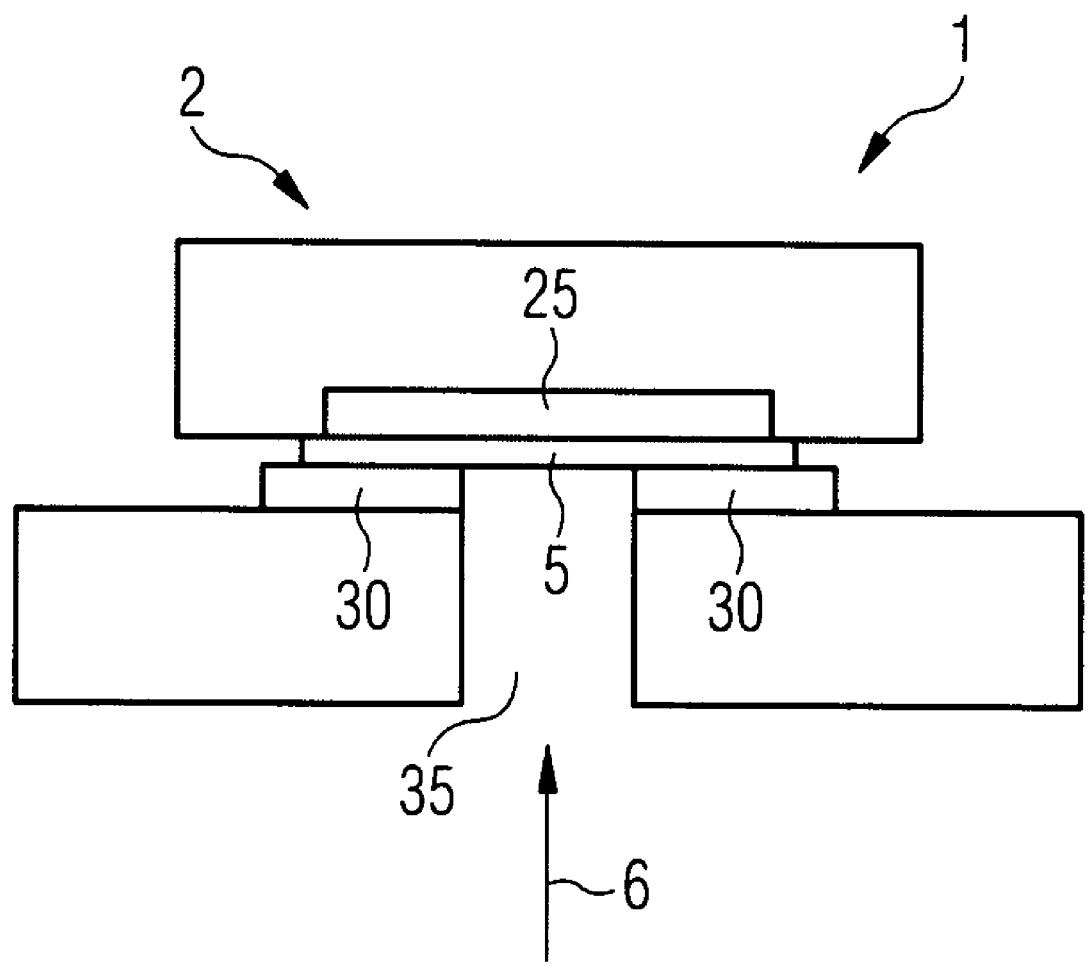

OPTOELECTRONIC MODULE

RELATED APPLICATIONS

This patent application claims the priority of German patent application 10 2006 036 544.5 filed Aug. 4, 2006, the disclosure content of which is hereby incorporated by reference.

FIELD OF THE INVENTION

The present invention relates to an optoelectronic module and to a method for producing an optoelectronic module.

BACKGROUND OF THE INVENTION

In the production of conventional optoelectronic modules, optoelectronic devices are arranged on circuit boards and soldered onto the latter. The so-called reflow soldering method is generally used for this purpose. In this case, an electrically conductive connection is produced between the connections of the optoelectronic devices and the conductor tracks of the circuit board by means of a solder by virtue of the circuit board together with the optoelectronic devices and the solder being heated in a furnace to a temperature lying above the melting point of the solder.

Soldering process durations of approximately five minutes are typical in reflow soldering. In this case, the maximum temperature set during the soldering process must be chosen such that although the solder melts, temperature-dictated damage to the devices to be soldered does not yet occur. Therefore, such reflow soldering is often difficult to realize for heat-sensitive devices.

SUMMARY OF THE INVENTION

It is an object of the present invention to provide an optoelectronic module which can be reliably produced in a simplified manner.

Another object of the present invention is to provide a method for producing such a module.

These and other objects are attained in accordance with one aspect of the present invention directed to an optoelectronic module that has an optoelectronic device with a contact conductor and a connection area formed on a connection carrier. In this case, the contact conductor is electrically conductively and/or thermally conductively connected to the connection area. A local, delimited heating region is formed on the contact conductor or the connection carrier has a cutout, which is at least partly covered by the contact conductor.

A large-area or complete heating of the optoelectronic module for the formation of the local, delimited heating region can advantageously be avoided. The cutout facilitates the formation of an electrically and/or thermally conductive connection by locally heating the contact conductor by means of coherent radiation that impinges on the optoelectronic module from that side of the connection carrier which is remote from the optoelectronic device.

A local, delimited heating region on the contact conductor is understood to mean, for example, an insular region of the contact conductor which is spaced apart at least from an edge of the contact conductor. A local, delimited heating region can arise for example in an impingement region of, preferably focused, coherent radiation, for example laser radiation, since large amounts of heat can be fed to a local region of the contact conductor by the radiation in a short time. Outside the impingement region, by contrast, the contact conductor is not directly heated by the radiation source and is therefore only comparatively weakly heated relative to the impingement region of the radiation. Furthermore, a local, delimited heating region on the contact conductor can be manifested in the fact that, in said region, the surface of the contact conductor is deformed or discolored, for example, as a consequence of a local heat input or the microstructure of the contact conductor is altered. By contrast, a local, delimited heating region does not occur in the course of heating in a furnace, as is typical in the reflow soldering method, since the entire component to be soldered and not just the contact conductor is locally heated.

Preferably, the local, delimited heating region is formed by means of locally heating the optoelectronic module by, preferably focused, coherent radiation, for example laser radiation.

According to an embodiment of the invention, the optoelectronic module has an optoelectronic device with a contact conductor and a connection carrier with a connection area. In this case, the contact conductor and the connection area are electrically conductively and/or thermally conductively connected by means of locally heating the optoelectronic module by coherent radiation, preferably laser radiation. Direct heating of the entire optoelectronic module and in particular of the entire contact conductor by means of the coherent radiation is advantageously not necessary for the production of the electrically conductive and/or thermally conductive connection between the contact conductor and the connection area.

This is particularly advantageous for optoelectronic devices since the latter are generally heat-sensitive and there is therefore the risk of permanent damage in the event of the optoelectronic devices being overheated.

In one configuration of the second embodiment, a local, delimited heating region is formed on the contact conductor or the connection carrier has a cutout, which is at least partly covered by the contact conductor.

A large-area or complete heating of the optoelectronic module can advantageously be avoided for the formation of the local, delimited heating region. The cutout facilitates the formation of an electrically and/or thermally conductive connection by locally heating the contact conductor by means of coherent radiation that impinges on the optoelectronic module from that side of the connection carrier which is remote from the optoelectronic device.

In one configuration, the local, delimited heating region is formed on a side of the contact conductor which is remote from the connection area. In this case, the local, delimited heating region can be formed by means of coherent radiation that impinges on the optoelectronic module from that side of the contact conductor which is remote from the connection area.

In a further configuration, the electrically conductive and/or thermally conductive connection between the contact conductor and the connection area is produced by means of a connecting means, in particular a solder. In particular, the solder is at least partly arranged between the contact conductor and the connection area.

In a further configuration, the optoelectronic device is embodied as a surface mountable device (SMD). Preferably, in this case the contact conductor is completely arranged on that side of the connection carrier which faces the optoelectronic device. Consequently, the contact conductor does not extend through a cutout in the connection carrier, as would be the case for a wired optoelectronic device (through-hole design).

In a further configuration, an optical unit is fixed to the optoelectronic device. The optical unit can be embodied as a separate optical unit. Consequently, it is, in particular, not part of an encapsulant into which a semiconductor chip of an optoelectronic device that is provided for generating radiation is usually embedded.

In one development, the optoelectronic device or the respective optoelectronic device has a housing body.

The optical unit can be fixed to the housing body. The optical unit can at least partly extend beyond a lateral face delimiting the housing body.

In one development, the optical unit contains a plastic. An optical unit of this type can advantageously be produced in a cost-effective manner. By way of example, the optical unit may contain a silicone, a thermoplastic or a thermosetting plastic. In particular, the melting point of the plastic may be lower than the melting point of the connecting means, for example of the solder.

The risk of damage to the optical unit in the course of forming the electrically conductive and/or thermally conductive connection between the contact conductor of the optoelectronic device is advantageously reduced on account of the only local heating of the optoelectronic module.

In a further configuration, the optoelectronic device has a further contact conductor.

In one configuration variant, the contact conductor and the further contact conductor project from different, in particular from opposite, sides of the housing body. Stresses that possibly occur during the mounting of the optoelectronic device thus act approximately symmetrically on the housing body and can at least partly compensate for one another. The risk of deformation of the optoelectronic device or of tilting of the optoelectronic device during mounting can advantageously be reduced in this way.

In a further configuration variant, at least one contact conductor is formed on that side of the housing body which faces the connection carrier. Contact conductors formed in this way enable particularly space-saving mounting of the optoelectronic devices.

In one development, the optoelectronic device has, in addition to two electrical contact conductors, a thermal contact conductor, which is formed on that side of the housing body which faces the connection carrier. In this case, the thermal contact conductor is provided for dissipating the heat generated during operation of the optoelectronic device into the connection carrier. Consequently, said thermal contact conductor is not provided for making electrical contact with the optoelectronic device. For efficient heat dissipation, a thermal contact conductor by comparison with an electrical contact conductor is preferably formed for a comparatively large-area connection to the associated connection area of the connection carrier.

A contact conductor of the optoelectronic device which is provided for electrically contact-connecting the device to the associated connection area can be embodied in metallic fashion and may contain a material having high electrical conductivity such as copper, for example, or comprise such a material.

In the case of a contact conductor which is provided for a thermal connection of the optoelectronic device to the associated connection area, a metallic embodiment is possible as in the case of an electrical contact conductor. An electrically insulating material having good thermal conductivity, for example a suitable ceramic, can also find application.

An electrically conductive connection is typically thermally conductive as well. In contrast to this, a thermally conductive connection need not necessarily be electrically conductive as well. An electrically conductive connection is not necessary particularly in the case of a contact conductor which is provided for a thermal connection of the optoelectronic device to the associated connection area.

The optoelectronic device can be embodied as a radiation-emitting device and furthermore as a light-emitting diode (LED) or laser diode.

In a further configuration, the optoelectronic module comprises at least one further optoelectronic device with a contact conductor. The optoelectronic devices are preferably arranged in a manner spaced apart from one another on the connection carrier. In particular, the contact conductor of each optoelectronic device is preferably assigned a respective connection area of the common connection carrier. It goes without saying that the optoelectronic module can also comprise considerably more than two optoelectronic devices, for example 20 optoelectronic devices or more.

The further optoelectronic device or the further optoelectronic devices can also have at least one of the features described in the previous configurations.

In a further possible configuration, at least two optoelectronic devices of the optoelectronic module emit radiation in different color regions of the electromagnetic spectrum. The optoelectronic module can have optoelectronic devices which emit in the red, green and blue color regions of the visible spectrum. In particular, the color loci and intensities of the radiation emitted by the optoelectronic devices are preferably chosen such that a white color impression arises for the human eye as a result of additive color mixing of the three color components red, green and blue. Such white mixed radiation is particularly expedient for optoelectronic modules which are provided for backlighting a display device, for example an LCD.

The optical unit can be formed for forming a directional emission characteristic of the optoelectronic device. Preferably, the emission characteristic is embodied in such a way that a uniform, homogeneous illumination of a display device by the optoelectronic module can be obtained in a simplified manner. An optical unit of this type which is arranged, and in particular fixed, at the housing body or at the housing body of the respective optoelectronic device enables a particularly space-saving design of the optoelectronic module and thus the formation of a particularly flat optoelectronic module for the backlighting of a display device.

Another aspect of the invention is directed to a method for producing an optoelectronic module comprising an optoelectronic device with at least one contact conductor and a connection carrier with at least one connection area comprising the steps of:

a) providing the connection carrier with the connection area, b) arranging the optoelectronic device on the connection carrier, and c) locally heating the optoelectronic module in a predetermined impingement region by means of coherent radiation. In this latter step, known herein as "step c)", an electrically conductive and/or thermally conductive connection is produced between the contact conductor and the connection area.

Accordingly, for producing an electrically conductive and/or thermally conductive connection between the contact conductor and the connection area, advantageously only a local region of the optoelectronic module is heated by means of the coherent radiation. Consequently, it is not necessary for the entire optoelectronic module to be heated. Furthermore, the heat input introduced overall into the optoelectronic module is advantageously reduced. This is particularly advantageous for optoelectronic devices since the latter are generally heat-sensitive and, therefore, complete heating of the optoelectronic device may lead to damage or destruction.

Consequently, in step c), the optoelectronic module is directly heated by the radiation only in the predetermined impingement region. In this case, a local, delimited heating region can form on the contact conductor, which region overlaps in particular the predetermined impingement region of the radiation in step c).

In one configuration, in step c), the optoelectronic module is moved relative to the radiation source during the production of the electrically and/or thermally conductive connection. The movement is preferably effected continuously, and is particularly preferably effected at a constant speed. By way of example, the optoelectronic module can be moved on a conveyor device, for instance a conveyor belt, during production. Interruption of the movement, for example by stopping the conveyor device, is not necessary for producing the electrically conductive and/or thermally conductive connection. The production duration for a plurality of optoelectronic modules can advantageously be shortened as a result.

The radiation is furthermore tracked to the movement of the optoelectronic module relative to the radiation source in such a way that the radiation impinges on the optoelectronic module within the predetermined impingement region during the heating. Direct heating of the optoelectronic module outside the predetermined impingement region by the radiation can thus be minimized.

In a further configuration, the radiation is directed onto the optoelectronic module by means of a movable deflection optical unit. Said movable deflection optical unit may be formed for example by means of a mirror that can be rotated with respect to at least one axis. The movable deflection optical unit is furthermore formed by means of two mirrors, in which case each mirror can be rotated about its own axis in each case. In particular, the deflection optical unit is embodied in such a way that the radiation can be deflected by rotation of the mirrors about the respective axis along two mutually perpendicular directions. As a result, the radiation can be directed onto the predetermined impingement region on the optoelectronic module in a simplified manner by means of the deflection optical unit.

In a further configuration, the coherent radiation source is formed by a laser, for example a solid-state laser. Laser radiation may be distinguished by particularly good focusability of the radiation and enables high power densities, in particular when focusing the laser radiation. As a result, a comparatively small region on the optoelectronic module can be locally heated. On account of the only local heating of the optoelectronic module, the heat input introduced overall into the optoelectronic module is advantageously comparatively low in comparison with the reflow soldering method.

The focusing of the laser radiation can be achieved by means of a beam concentrating optical unit. In this case, the concentration of the laser radiation is preferably effected before the radiation impinges on the deflection optical unit.

In one development, the power density of the coherent radiation that impinges in the predetermined impingement region amounts in this region to between 1 and 500 W/(mm$^2$) inclusive, particularly preferably between 10 and 150 W/(mm$^2$) inclusive. On account of the high power densities in comparison with the reflow soldering method, a large amount of heat can be deposited within the predetermined impingement region in a very short time, whereby the production duration of an electrically conductive and/or thermally conductive connection can be shortened.

In a further development, in step c), the radiation from the radiation source impinges on the predetermined impingement region on the optoelectronic module for 2 s or less, preferably 500 ms or less, for example 200 ms. On account of the high power densities that can be obtained by means of a coherent radiation source, such a short irradiation time is sufficient for producing an electrically conductive and/or thermally conductive connection.

The production of an electrically conductive and/or thermally conductive connection can therefore advantageously be shortened. Particularly in the case of an optoelectronic module which contains only comparatively few optoelectronic devices, for instance 100 devices or fewer, the duration of the production of the electrically conductive and/or thermally conductive connections for an optoelectronic module is advantageously shortened by comparison with the reflow method.

In one configuration, in step c), the movable deflection optical unit is moved proceeding from a starting position for tracking the radiation, and the deflection optical unit is returned to the starting position after step c) in a step d). It is furthermore the case that, after step d), step c) is carried out for a further, separate optoelectronic module. By iteratively repeating the method, a plurality of optoelectronic modules can thus be produced rapidly and cost-effectively.

In a further configuration, the electrically conductive and/or thermally conductive connection is produced by means of an electrically conductive and/or thermally conductive connecting means, for example a solder or a solder paste. The energy introduced into the predetermined impingement region by means of the radiation from the coherent radiation source is expediently sufficient to heat the thermally conductive and/or electrically conductive connecting means above the melting point thereof. An electrically conductive and/or thermally conductive and preferably mechanically stable connection is then formed after the connecting means has cooled.

The electrically conductive and/or thermally conductive connecting means can be applied to the connection carrier at least in regions, and in particular to the connection areas of the connection carrier, before step c).

In a variant of the method, in step c), the radiation impinges on the contact conductor from that side of the contact conductor which is remote from the connection carrier. In this case the connecting means can be heated through the contact conductor to a temperature above the melting point of the connecting means. This variant is primarily expedient if the contact conductor projects laterally from the housing body of the optoelectronic module and is thus accessible from that side of the contact conductor which is remote from the connection carrier.

In a further variant, the radiation from the radiation source is radiated through a cutout of the connection carrier from that side of the connection carrier which is remote from the contact conductor. In particular, the radiation passing through the cutout leads to heating of the connecting means to a temperature above the melting point of the connecting means, so that a thermally conductive and/or electrically conductive connection between the contact conductor and the connection area is produced by means of the momentarily liquefied connecting means.

In a further configuration, the radiation from the radiation source is split into a plurality of partial beams by means of a beam-splitting assembly before impinging on the optoelectronic module. Particularly preferably, the beam-splitting assembly is arranged in the beam path between the radiation source and the deflection optical unit, in particular between an optical fiber into which the radiation from the radiation source is coupled and the beam concentrating optical unit. The plurality of partial beams can therefore be directed onto the optoelectronic module by means of the deflection optical unit, so that the optoelectronic module can be locally heated simultaneously in a plurality of predetermined impingement regions. In this case, the number of partial beams corresponds to the number of predetermined impingement regions.

The beam-splitting assembly can be formed in movable fashion in such a way that a distance at which a partial beam and a further partial beam impinge on the optoelectronic module can be set by means of a movement of the beam-splitting assembly along the beam path of the coherent radiation. In this case, the distance at which the partial beam and the further partial beam impinge on the optoelectronic module can be set by means of movement of the beam-splitting assembly in such a way that, in step c), the partial beams in each case impinge on the optoelectronic module within a predetermined impingement region. Consequently, an electrically and/or thermally conductive connection to the respective connection area can be produced simultaneously within each impingement region.

Particularly in the case of optoelectronic devices which have two contact conductors and are formed symmetrically with regard to the contact conductors, in the case of simultaneously producing an electrically conductive and/or thermally conductive connection of two contact conductors to the respective connection area, it is possible to achieve a reduction of the stresses that occur during the production of the contact.

Typically, an optoelectronic module comprises a plurality of optoelectronic devices each having a contact conductor and a further contact conductor. In this case, the contact conductors are respectively assigned a dedicated connection area on the connection carrier. The at least one further optoelectronic device is likewise arranged on the connection carrier in step b).

In step c), firstly the contact conductor and the further contact conductor of an optoelectronic device can be electrically conductively and/or thermally conductively connected to the respectively assigned connection area and step c) is subsequently carried out for a further optoelectronic device of the same optoelectronic module.

It is also conceivable for the number of partial beams made available to be such that all the contact conductors of the optoelectronic devices of an optoelectronic module are simultaneously electrically conductively and/or thermally conductively connected to the respective connection area. For this purpose, the number of partial beams expediently corresponds to the total number of contact conductors of the optoelectronic devices of an optoelectronic module. This enables a particularly short manufacturing duration for an optoelectronic module. The throughput in the production of a plurality of optoelectronic modules can advantageously be increased in this way.

In a further configuration, the optoelectronic device is pressed onto the connection carrier in step c). The force with which the optoelectronic device is pressed on may be between 1 N and 100 N inclusive, preferably between 2 N and 20 N inclusive, for example 5 N. The heat introduced into the optoelectronic device by means of the radiation can thus be transferred in an improved manner into the connecting means and the connection area assigned to the contact conductor. The risk of overheating of the optoelectronic device in step c) is advantageously reduced as a consequence.

In a further configuration, before step c), and in particular before step b), an optical unit is fixed to the optoelectronic device or to the respective optoelectronic device. Since, in step c), the optoelectronic module is heated predominantly in the predetermined impingement region or the respective predetermined impingement region, it is possible to considerably reduce heating of the optical unit during the production of an electrically conductive and/or thermally conductive connection of the contact conductor to the respective connection area. On account of the greatly reduced heating—in comparison with a reflow soldering method—of the optoelectronic module outside the predetermined impingement region in step c), it is advantageously possible to equip the optoelectronic devices with a respective optical unit even when the melting point of the material of the optical unit lies below the melting point of the connecting means. The production of the optoelectronic module can thus be simplified.

BRIEF DESCRIPTION OF THE DRAWINGS

FIG. 6 shows a schematic illustration of a further exemplary embodiment of step c) of a method according to the invention.

DETAILED DESCRIPTION OF THE DRAWINGS

Figure 1:
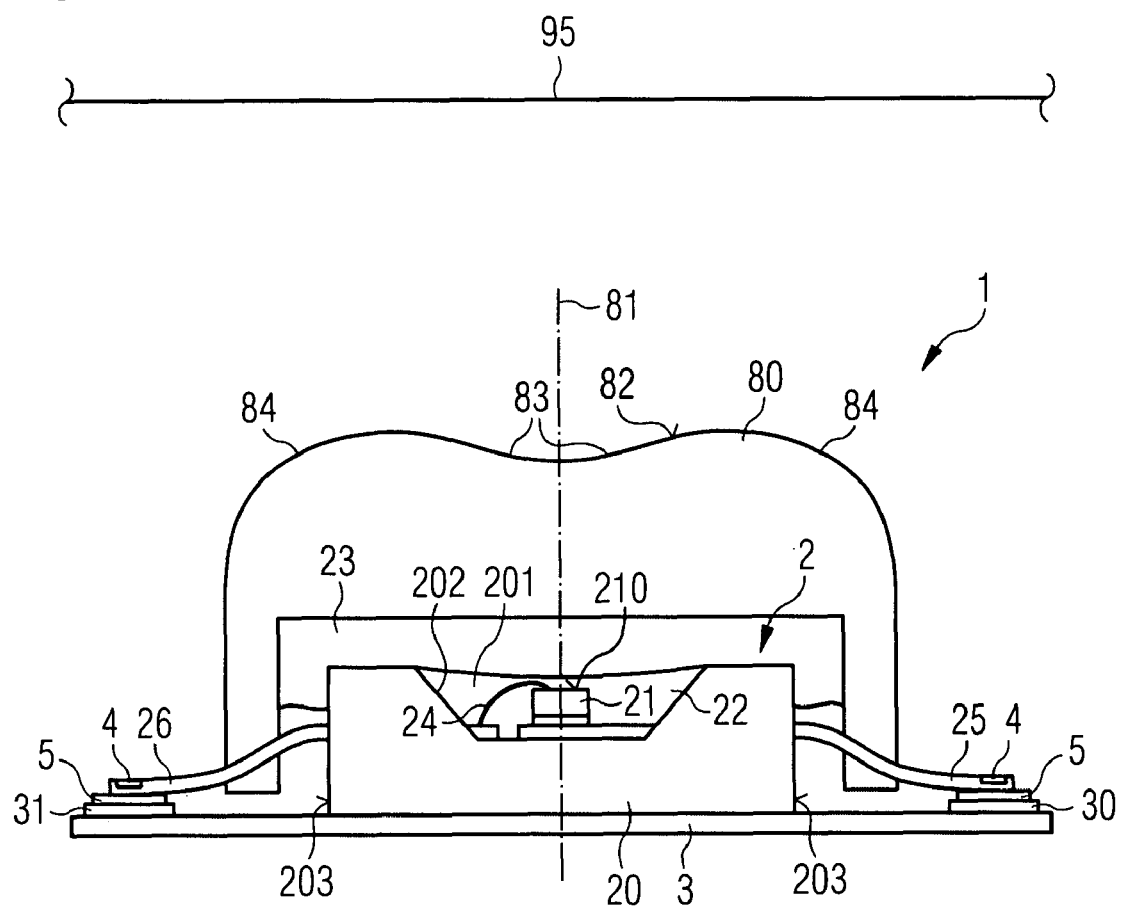
FIG. 1 shows a first exemplary embodiment of an optoelectronic module according to the invention on the basis of a schematic sectional view.

FIG. 1 shows a schematic sectional view of an optoelectronic module 1 according to the invention. The optoelectronic module comprises an optoelectronic device 2 having a contact conductor 25 and a further contact conductor 26. Furthermore, the optoelectronic device comprises a housing body 20 delimited by lateral faces 203 in the lateral direction. The contact conductors 25 and 26 project laterally from the housing body. In particular, the two contact conductors project from two opposite lateral faces 203 of the housing body. This enables mounting of the optoelectronic device at the connection carrier, in which case stresses that possibly occur during mounting act predominantly symmetrically on the housing body and can at least partly compensate for one another.

The housing body 20 preferably contains a plastic or is manufactured from a plastic. Housing bodies of this type are distinguished primarily by particularly cost-effective production. As an alternative, the housing body may contain a ceramic, for example AlN or AlO, or be manufactured from a ceramic. Ceramic materials may be distinguished by a high thermal conductivity. Heat generated during operation of the optoelectronic device can thus be dissipated from the optoelectronic device particularly well via the housing body.

The optoelectronic device further comprises a semiconductor chip 21 provided for generating radiation. The housing body 20 has a cavity 201, in which the semiconductor chip is arranged. A wall 202 of the cavity 201 can be formed as a reflector for radiation generated in the semiconductor chip. The power of the radiation emerging from the optoelectronic device can thus be increased.

The semiconductor chip 21 is arranged on the contact conductor 25 and is electrically conductively connected thereto. An electrically conductive connection of the semiconductor chip to the contact conductor 26 is effected by means of a bonding wire 24, for example, which is led from a surface 210 of the semiconductor chip that is remote from the connection carrier to the contact conductor 26.

Furthermore, the semiconductor chip 21 is preferably embedded into an enclosure 22, which particularly preferably completely covers the semiconductor chip and the bonding wire 24. Said enclosure can serve to protect the semiconductor chip and the bonding wire against mechanical loading and external ambient influences.

The optoelectronic device 2 is arranged on a connection carrier 3 of the optoelectronic module 1. In this case, the connection carrier has a connection area 30 and a further connection area 31, the contact conductor 25 being electrically conductively connected to the connection area 30 and the further contact conductor 26 being electrically conductively connected to the further connection area 31. A connecting means 5 can be arranged between the contact conductors and the respective connection areas, said connecting means producing an electrically conductive contact between the contact conductors and the connection areas. The connecting means may be for example a solder, in particular a lead-free solder, for instance an SnAg solder paste with flux. A connection carrier 3 on which a connecting means has already been deposited can also be used. By way of example, the connection carrier may be embodied as a circuit board that has already been pre-tin-plated. Typically, a tin-containing layer having a thickness of between 10 μm and 20 μm inclusive is applied on such a circuit board at least in regions.

A local, delimited heating region 4 is in each case formed on that side of the contact conductors 25 and 26 which is remote from the connection areas. These local, delimited heating regions can be produced by means of coherent radiation, for example. Preferably, the contact conductors 25 and 26 are embodied in metallic fashion or contain at least one metal. Metals having high electrical conductivity, such as, for example, copper, nickel, gold, titanium or platinum, are particularly suitable. As shown in FIG. 1, an optical unit 80 can be fixed to the optoelectronic device 2. The Figure shows a slip-over optical unit, by way of example. In the case of a slip-over optical unit, the optical unit at least partly reaches around the housing body 20 circumferentially. The optical unit is preferably fixed mechanically stably and permanently to the optoelectronic device, in particular to the housing body. An intermediate layer 23, for example, which at least partly fills the interspace between the housing body or the enclosure 22 and the optical unit 80 can be used for fixing. Preferably, the optical unit projects in the lateral direction beyond the lateral face 203 delimiting the semiconductor body in the lateral direction.

It goes without saying that the optical unit 80 can also be fixed to the optoelectronic device 2 in a different way. By way of example, the optical unit can be plugged on and, if appropriate, additionally be adhesively bonded on.

A radiation exit area 82 of the optical unit 80 is preferably formed rotationally symmetrically with respect to an optical axis 81 of the optical unit. The optical axis 81 particularly preferably passes through the semiconductor chip 21. It is thus advantageously possible for the radiation generated in the semiconductor chip to be coupled out from the optoelectronic device rotationally symmetrically with respect to the optical axis.

The optical unit 80 can be embodied for forming a predetermined, in particular directional emission characteristic of the radiation generated by the optoelectronic device 2. Since only local heating of the optoelectronic device is necessary for forming the electrically conductive connection of the contact conductors 25 and 26 of the optoelectronic device to the associated connection areas 30 and 31, the risk of damage to an optical unit fixed on the optoelectronic device can be reduced.

Furthermore, an optical unit 80 fixed directly to the optoelectronic device enables a particularly space-saving design of the optoelectronic module 1. This is particularly advantageous for optoelectronic modules which are provided for backlighting of a display device, such as an LCD for example.

For forming a particularly uniform and, in particular in comparison with the lateral extent of the semiconductor chip 21, large-area illumination of a display device 95, the optical unit 80 is preferably embodied in such a way that radiation emerging from the semiconductor chip, in particular through a radiation coupling-out area 210, is predominantly not emitted along the optical axis 81, but rather at a comparatively large angle with respect to the optical axis. In this case, the region of the display device that is to be illuminated typically extends perpendicular to the optical axis.

For this purpose, the radiation exit area 82 of the optical unit 80 preferably has a concavely curved partial region 83, through which the optical axis 81 particularly preferably passes. This concavely curved partial region acts like a divergent lens for radiation that emerges from the semiconductor chip 21 and impinges on said region, so that the radiation is refracted away from the optical axis. Illumination of a large display device region in comparison with the lateral extent of the semiconductor chip is thus fostered.

Circumferentially, the concavely curved partial region is at least partly surrounded by a convexly curved partial region 84. The radiation which is generated in the semiconductor chip and impinges on the convexly curved partial region 84 is likewise refracted away from the optical axis, thereby fostering emission from the optoelectronic device at large angles with respect to the optical axis.

The semiconductor chip 21, and in particular an active region of the semiconductor chip that is provided for generating radiation, preferably contains a III-V semiconductor. III-V semiconductors, in particular $In_xGa_yAl_{1-x-y}P$, $In_xGa_yAl_{1-x-y}N$ or $In_xGa_yAl_{1-x-y}As$, in each case where $0 \leq x \leq 1$, $0 \leq y \leq 1$ and $x+y \leq 1$, are distinguished by high quantum efficiencies that can be obtained, which enables a high conversion efficiency of electrical energy into, preferably visible, radiation power.

Semiconductors based on the material system $In_xGa_yAl_{1-x-y}N$ are particularly suitable for the ultraviolet spectral range. In the visible spectral range, the material system $In_xGa_yAl_{1-x-y}N$ is suitable for colors in the range from blue to green. $In_xGa_yAl_{1-x-y}P$, for example, is particularly suitable for the yellow to red spectral range. The material system $In_xGa_yAl_{1-x-y}As$, in particular, finds application in the infrared range.

Figure 2A:
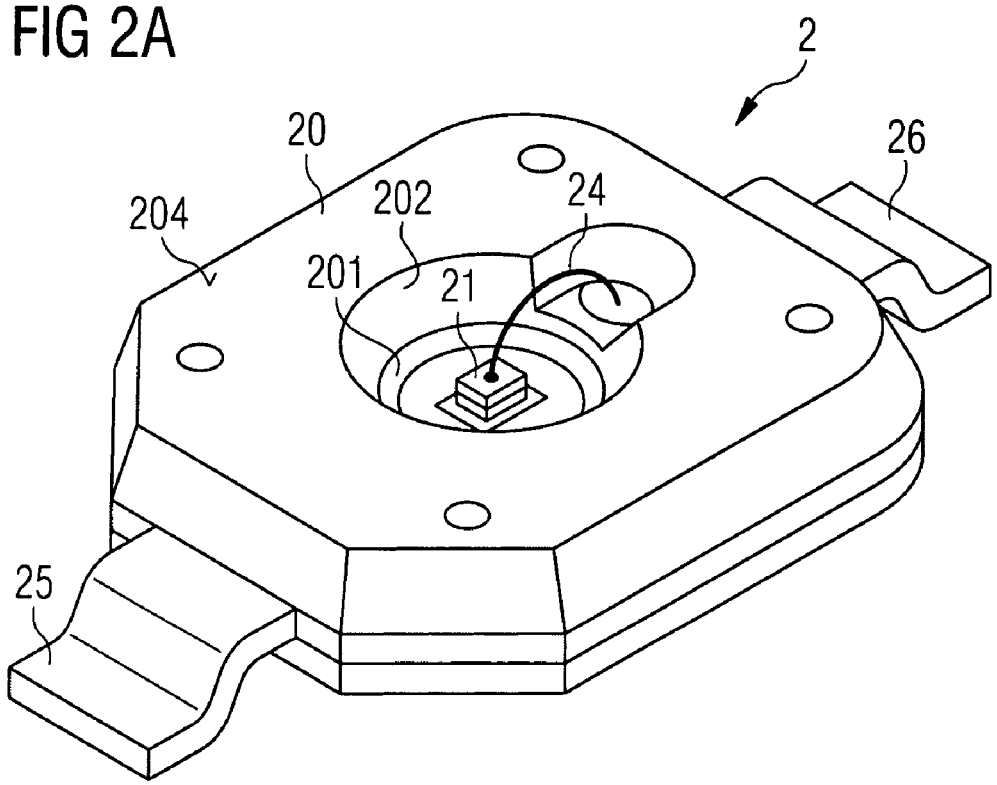
FIG. 2A shows a perspective schematic view of an exemplary embodiment of an optoelectronic device that is particularly suitable for an optoelectronic module according to the invention and FIG. 2B shows a schematic sectional view of the optoelectronic device from FIG. 2A.
Figure 2B:
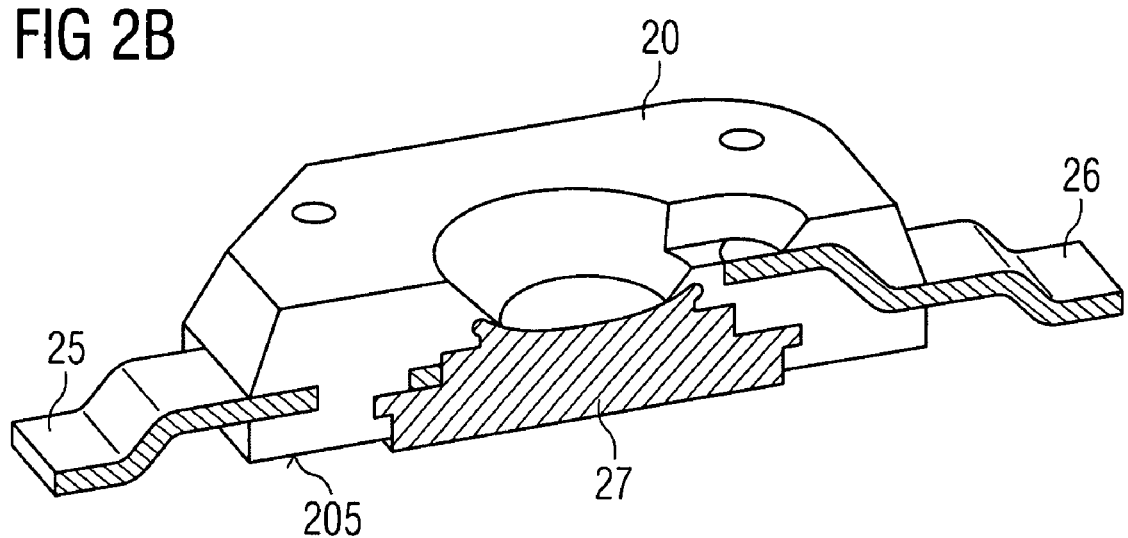
Figure 3:
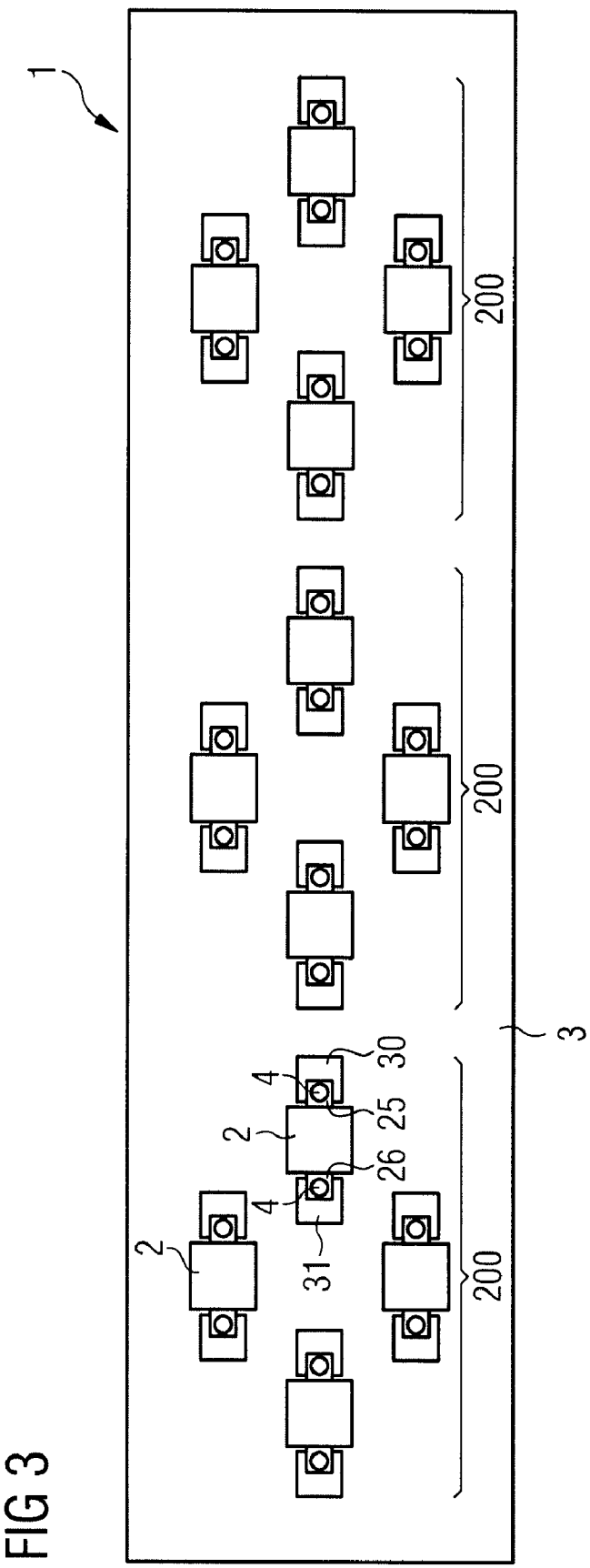
FIG. 3 shows a schematic plan view of a further exemplary embodiment of an optoelectronic module.

It goes without saying that the optoelectronic module within the scope of the invention can also have more than one optoelectronic device. FIG. 3 shows for example an optoelectronic module in which in each case four optoelectronic devices 2, which can in each case be embodied as described in connection with FIG. 1 or FIGS. 2A and 2B, are combined to form a group of optoelectronic devices 200. A rhomboidal arrangement of the optoelectronic devices 2 of a group of optoelectronic devices 200 has proved to be particularly advantageous.

In the exemplary embodiment, three such groups are arranged alongside one another at a centroidally equidistant distance from one another. It goes without saying that the number of groups of optoelectronic devices 200 can differ from three.

A group of optoelectronic devices 200 in each case preferably contains optoelectronic devices 2 which emit at least in two different spectral color regions of the, in particular visible, spectral range. Preferably, the optoelectronic devices 2 are in this case formed, in particular with regard to color locus and power of the emitted radiation, in such a way that white mixed light arises as a result of additive color mixing of the radiation emitted by the optoelectronic devices of a group 200.

Particularly preferably, a group 200 comprises an optoelectronic device 2 which emits in the blue spectral range, an optoelectronic device 2 which emits in the green spectral range, and a further optoelectronic device 2 which emits in the red spectral range. In the case of a group of optoelectronic devices 200 comprising four optoelectronic devices, the group preferably has a total of two optoelectronic devices 2 which emit radiation in the green spectral range. By means of a second one in the green spectral range, the radiation power can be set in a simplified manner in this spectral range such that white mixed light arises.

An optoelectronic module 1 which has such groups of optoelectronic devices 200, provided for generating white mixed light, is therefore particularly suitable for backlighting a display device 95.

The groups 200 of the optoelectronic devices are preferably arranged centroidally at an equidistant distance from one another, thereby enabling an area of a display device that is to be illuminated to be subjected to illumination that is as far as possible uniform and homogeneous over a large region. It goes without saying that the groups of the optoelectronic devices 200 can also be arranged in matrix-like fashion or in the form of a honeycomb pattern in order to enable large-area illumination of a display device.

An alternative exemplary embodiment of an optoelectronic device is shown in FIGS. 2A and 2B, wherein FIG. 2A offers a perspective view of the optoelectronic device. FIG. 2B shows a perspective sectional view through the illustration of FIG. 2A. The optoelectronic device differs from the optoelectronic device shown in FIG. 1 by virtue of the fact that the optoelectronic device has an additional thermal contact conductor 27 in addition to the electrical contact conductors 25 and 26. The semiconductor chip 21 is arranged on the thermal contact conductor 27 and mechanically stably connected thereto preferably by a thermally conductive connecting means. The thermal contact conductor is predominantly not formed for the electrical contact-connection of the semiconductor chip, but rather for the dissipation of the heat generated in the semiconductor chip during the operation of the optoelectronic device from the semiconductor chip. This is particularly advantageous for high-power light emitting diodes provided for generating radiation with a comparatively high output power. The power consumption of such high-power light emitting diodes can be 1 W or more in this case. The electrical contact-connection is once again effected by means of the electrical contact conductors 25, 26.

The semiconductor chip is once again arranged in a cavity 201, the cavity being formed in a surface 204 of the housing body 20.

The thermal contact conductor preferably extends from the bottom of the cavity 206 as far as a surface 205 of the housing body 20 which is remote from the surface 204. Particularly preferably, the thermal contact conductor projects from the housing body on the side of the surface 205. In the event of mounting the device, the optoelectronic device therefore predominantly bears on the thermal contact conductor, which enables the heat generated in the semiconductor chip 21 during operation of the optoelectronic device to be dissipated particularly efficiently. The heat dissipation can therefore be effected independently of the electrical contact conductors 25 and 26 additionally and predominantly by the thermal contact conductor 27.

Figure 4A:
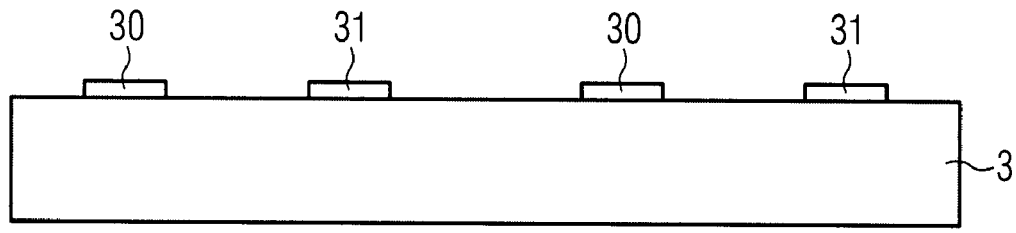
FIGS. 4A to 4D show a schematic sectional view of an exemplary embodiment of a method according to the invention for producing an optoelectronic module on the basis of intermediate steps.

FIGS. 4A to 4D schematically show an exemplary embodiment of a method according to the invention for producing an optoelectronic module. In this case, the production of an optoelectronic module with two optoelectronic devices is illustrated by way of example. It goes without saying that an optoelectronic module can also have only one optoelectronic device or more than two optoelectronic devices. As shown in FIG. 4A, firstly a connection carrier 3 is provided. In this example, the connection carrier has a total of four connection areas 30, 31, a connection area in each case being assigned to a contact conductor of the optoelectronic device to be fixed.

Figure 4B:
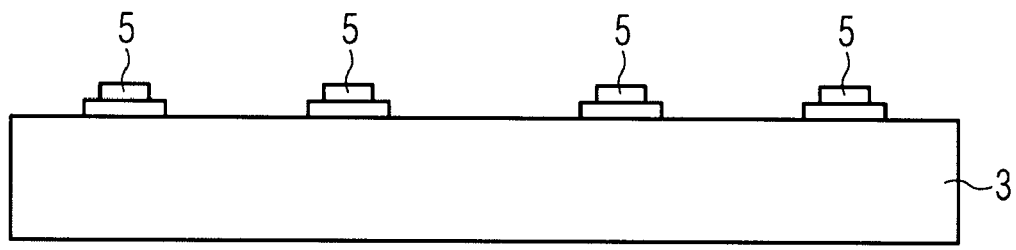

Optionally, a connecting means 5 can subsequently be applied for example on the connection carrier 3 (FIG. 4B). This is not absolutely necessary, however. As an alternative, the connecting means can for example also be applied on the contact conductors of the respective optoelectronic device to be fixed. A connection carrier 3 on which a connecting means has already been deposited can also be used. This may be a pre-tin-plated circuit board, for example.

Figure 4C:
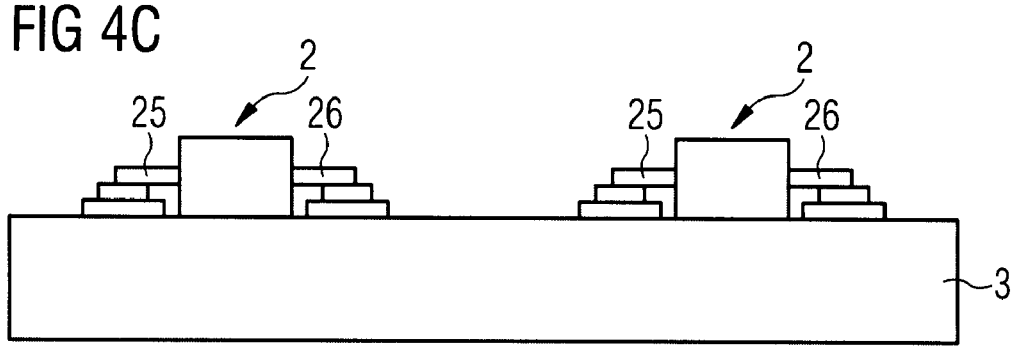

The optoelectronic devices 2 are thereupon arranged on the connection carrier 3 (FIG. 4C). In this case, the optoelectronic devices 2 each have a contact conductor 25 and a further contact conductor 26. The optoelectronic devices are arranged on that side of the connection carrier on which the connection areas 30 and 31 are formed. Preferably, the optoelectronic devices are oriented with respect to the connection carrier in such a way that the contact conductors 25 and 26 at least partly overlap the associated connection areas 30 and 31, respectively.

The connection carrier 3 may be for example a circuit board, for instance a printed circuit board (PCB), in which case the connection areas 30, 31 may be formed by means of conductor tracks of the circuit board.

Figure 4D:
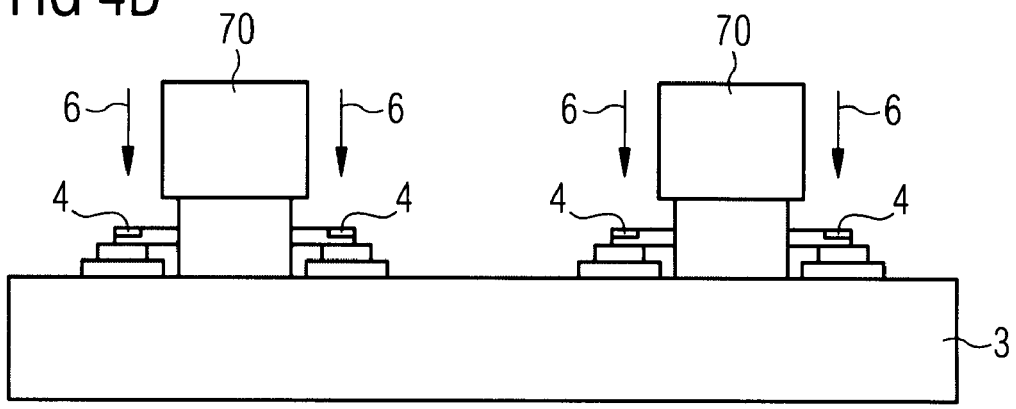

As shown in FIG. 4D, a local, delimited heating region is formed on that side of the contact conductors 25 and 26 which is remote from the connection areas 30 and 31, respectively.

These local, delimited heating regions 4 arise owing to local heating of the optoelectronic module, an electrically conductive and/or thermally conductive connection being produced between the contact conductors 25 and 26 and the associated connection areas 30 and 31, respectively. In this case, the local heating is realized by means of coherent radiation 6, for example laser radiation. The coherent radiation impinging on the contact conductor from that side of the contact conductor which is remote from the connection carrier.

The energy introduced into the respective contact conductor 25, 26 by means of the radiation is expediently chosen to have a magnitude such that the connecting means 5 arranged at least in regions between the contact conductors 25 and 26 and the respective connection area 30 and 31 is heated above its melting point and melts. After the conclusion of the irradiation, the connecting means cools down, such that an electrically conductive and/or thermally conductive connection between the contact conductors and the respective connection areas arises after the solidification of the connecting means. These electrically conductive and/or thermally conductive connections preferably serve in addition for the mechanically stable fixing of the optoelectronic devices to the connection carrier.

Furthermore, the contact conductor 25 and, if appropriate, the further contact conductor 26 is preferably embodied in such a way as to simplify a thermally conductive and/or electrically conductive connection by means of a connecting means. The contact conductor may be pre-tin-plated, for example, that is to say that the contact conductor is coated with a tin layer completely or at least in regions.

The optoelectronic devices 2 can be pressed onto the connection carrier by means of a pressing-on device 70 during the production of an electrically conductive and/or thermally conductive connection of the contact conductors 25 and 26 to the respective connection areas 30 and 31. The force with which the optoelectronic device is pressed on may be between 1 N and 100 N inclusive, preferably between 2 N and 20 N inclusive, for example 5 N. A thermal connection of the contact conductor to the underlying connecting means 5 can thereby be fostered during the local heating of the respective contact conductor. The magnitude of the energy which has to be introduced into the contact conductor in the form of radiation for the melting of the connecting means can be advantageously reduced in this way. The risk of damage to the optoelectronic device or the optical unit fixed thereto, for example on account of irreversible deformation caused thermally, can thus be reduced.

The power density of the coherent radiation 6 which impinges in the predetermined impingement region 45 (see FIG. 5) is preferably between 1 and 500 W/(mm$^2$) inclusive, particularly preferably between 10 and 150 W/(mm$^2$) inclusive, in said region.

The production of an electrically and/or thermally conductive connection between the contact conductors 25 and 26 and the associated connection areas 30 and 31 can be individually effected sequentially for each contact conductor. As an alternative, the coherent radiation can be split into a plurality of partial beams, such that the optoelectronic module can be locally heated simultaneously at a plurality of locations and an electrically conductive and/or thermally conductive connection between a plurality of contact conductors 25 and 26 and an associated connection area 30, 31 can thus be obtained simultaneously.

Figure 5:
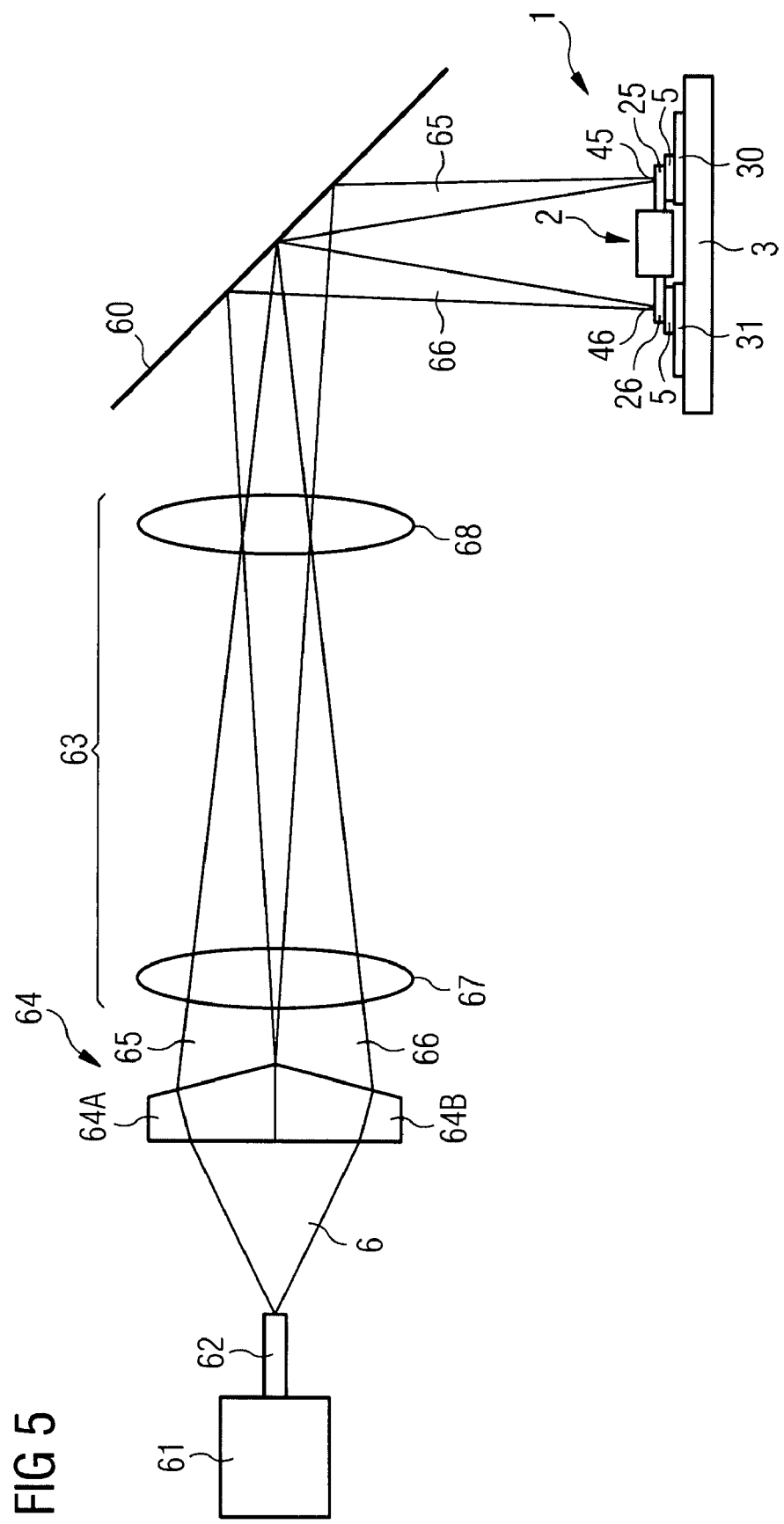
FIG. 5 shows a schematic illustration of an exemplary embodiment of a device for carrying out step c) of a method according to the invention.

FIG. 5 schematically illustrates an exemplary embodiment of a device for producing an electrically conductive and/or thermally conductive connection. For the sake of clarity, the optoelectronic module 1 shown comprises only one optoelectronic device 2. It goes without saying, however, that the optoelectronic module can also have a plurality of optoelectronic devices. A radiation source 61 of the coherent radiation 6 is embodied as a solid-state laser, for example as an Nd-YAG laser. The laser is preferably operated in the continuous wave operating mode (cw mode). The radiation that emerges from the coherent radiation source 61 is coupled into an optical waveguide fiber 62. The radiation that emerges from said optical waveguide fiber is split into a partial beam 65 and a further partial beam 66 by means of a beam-splitting assembly 64.

The beam splitting assembly 64 is preferably formed such that it is movable along the beam path of the coherent radiation 6. By way of example, the beam-splitting assembly is formed by means of two wedge plates 64A and 64B adjoining one another. By means of movement of the beam-splitting assembly along the beam path, the distance at which the partial beams impinge on the optoelectronic module 1 can thus be set in a simplified manner.

It goes without saying that the beam-splitting assembly can also be formed for forming more than two partial beams. By way of example, four partial beams can be generated by arranging a further pair of wedge plates in the beam path of the coherent radiation 6, the area in which the two wedge plates of the further pair abut one another and the area in which the wedge plates of the first pair of wedge plates adjoin one another being arranged at an acute angle different than 0° or at a right angle with respect to one another. As an alternative, the movable beam-splitting group 64 can be dispensed with. Only one beam is made available in this case.

The partial beams 65 and 66 shown in FIG. 5 are fed to a radiation concentrating optical unit 63. The beam concentrating optical unit comprises a collimation optical unit 67 and a focusing optical unit 68. The two partial beams are collimated by means of the collimation optical unit and subsequently focused by means of the focusing optical unit, such that the radiation can be concentrated at two focal points spaced apart from one another.

The radiation that emerges from the radiation concentrating optical unit 63 is subsequently deflected onto the optoelectronic module 1 by means of a deflection optical unit 60.

In this case, the distance at which the partial beams 65 and 66 impinge on the optoelectronic module can be set by means of movement of the beam-splitting assembly 64 along the beam path in such a way that the partial beam 65 impinges within a first predetermined impingement region 45 on the optoelectronic module 1 and the further partial beam 66 impinges within a further predetermined impingement region 46 on the optoelectronic module.

Preferably, the partial beams 65 and 66 impinge on the contact conductor 25 and the contact conductor 26, respectively, of the optoelectronic device 2. On the respective contact conductors 25 and 26, a local delimited heating region 4 is in each case formed by the local heating of the contact conductors by means of the coherent radiation 6, said heating region at least partly overlapping the respective impingement regions 45 and 46 of the coherent radiation 6.

On account of the radiation being split into two partial beams, it is possible, in particular, to locally heat two contacts of the optoelectronic device simultaneously and therefore to simultaneously produce an electrically conductive and/or thermally conductive connection of the contact conductors 25 and 26 to the respective connection areas 30 and 31. This accelerates the production of the optoelectronic module. In an optoelectronic device 2 in which the contact conductors project from opposite sides of the housing body 20, simultaneous production of an electrically and/or thermally conductive connection is particularly advantageous, moreover, since the heat input into the optoelectronic device 2 is thus comparatively symmetrical with respect to the contact conductors. The risk of deformation or tilting of the optoelectronic device on account of thermal stresses caused by asymmetrical heating during the local heating of the optoelectronic device can be advantageously reduced in this way.

It goes without saying that it is possible, as described in connection with FIG. 4, for the optoelectronic device 2 once again to be pressed on by means of a pressing-on device 70 during the production of an electrically and/or thermally conductive connection of the contact conductors 25 and 26 to the respective connection areas 30 and 31. This is not explicitly shown for reasons of clarity.

The deflection optical unit 60 may be formed by means of a mirror, which is preferably mounted such that it is movable at least with respect to one axis. Rotation of the mirror with respect to said axis therefore makes it possible to vary the position at which the coherent radiation 6 impinges on the optoelectronic module 1 along one direction. The deflection optical unit 60 is particularly preferably formed by means of two mirrors, in which case said mirrors can be rotated about their own axis in each case. In particular, the mirrors and the associated axes are oriented with respect to one another in such a way that the position at which the radiation 6 impinges on the optoelectronic module 1 can be varied by means of rotation of the first mirror in a first direction and by means of the second mirror in a direction perpendicular to the first direction. The coherent radiation can thus be directed onto the predetermined impingement region on the optoelectronic module in a simplified manner.

In contrast to what is shown in FIG. 5, the radiation from the radiation source 61 can also impinge on the optoelectronic module 1 from that side of the connection carrier 3 which is remote from the optoelectronic device 2. This is illustrated in FIG. 6. In this case, the radiation 6 passes through a cutout 35 in the connection carrier 3 and leads to local heating of the connecting means 5, such that a thermally and/or electrically conductive connection is produced between the contact conductor 25 and the connection area 30.

The cutout 35 may be formed as a drilled hole, for example. The diameter of the cutout is preferably 5 mm or less, particularly preferably 3 mm or less, for example 2 mm.

It goes without saying that in this variant, too, the optoelectronic device 2 can have more than one contact conductor 25. In this case, the contact conductors can be assigned a respective cutout on the optoelectronic module.

An optoelectronic device in which the contact conductors or the plurality of contact conductors are formed on that side of the optoelectronic device which faces the connection carrier is distinguished by the fact that the optoelectronic device can be arranged on the connection carrier in particularly space-saving fashion. As a result, it is possible to arrange a plurality of optoelectronic devices in an optoelectronic module at a particularly small distance from one another. Furthermore, this variant is suitable particularly for a thermal contact conductor of an optoelectronic device 2 since it is possible to form a comparatively large-area connection to the associated connection area of the connection carrier for efficient heat dissipation.

The optoelectronic device 2 is preferably embodied as a surface mountable device (SMD). In this case, the connection area 30 assigned to the contact conductor 25 and, if appropriate, to the further contact conductor 26 is arranged on that side of the connection carrier which faces the optoelectronic device. Consequently, the contact conductors do not extend through the connection carrier 3 and in particular through the cutout 35 of the connection carrier.

For the production of an electrically and/or thermally conductive connection by means of radiation which is radiated in through the cutout 35, it is expedient for the contact conductor 25 and the cutout to at least partly overlap. The connecting means 5 and the cutout also preferably at least partly overlap. In this way, a thermally and/or electrically conductive connection between the contact conductor 25 and the assigned connection area 30 can be produced in a simplified manner.

It goes without saying that the further features of the method which have been described in connection with FIGS. 4 and 5 can also be applicable to a method in accordance with FIG. 6. In particular, the optoelectronic module can comprise a plurality of optoelectronic devices.

Figure 7A:
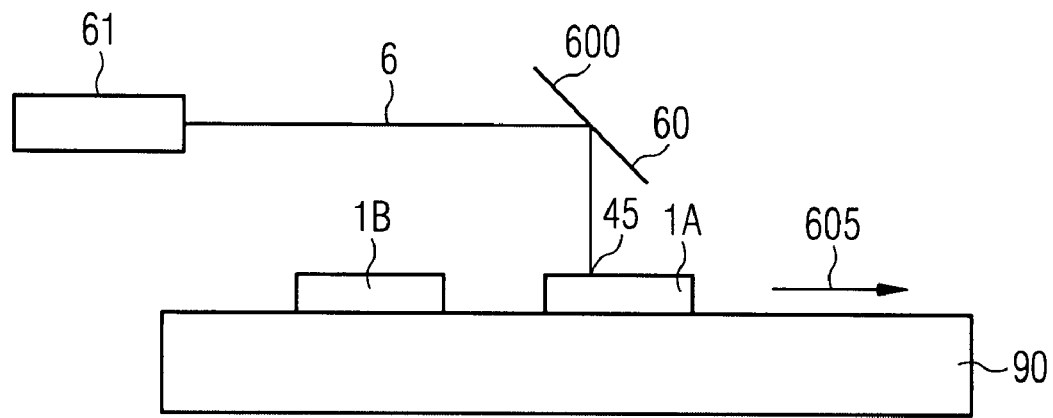
FIGS. 7A-7C show a schematic illustration of a further exemplary embodiment of a method according to the invention in which radiation used to effect a connection follows movement of an optoelectronic module on a conveyor belt.
Figure 7B:
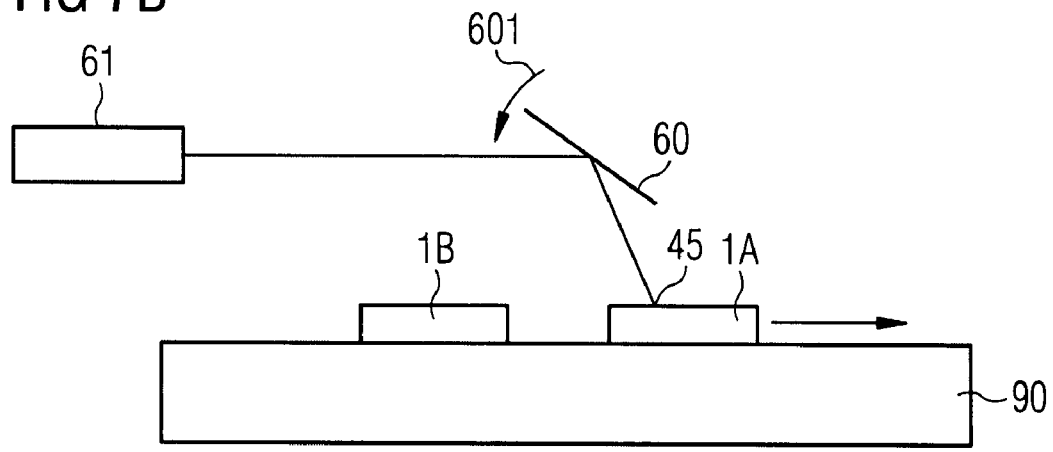
Figure 7C:
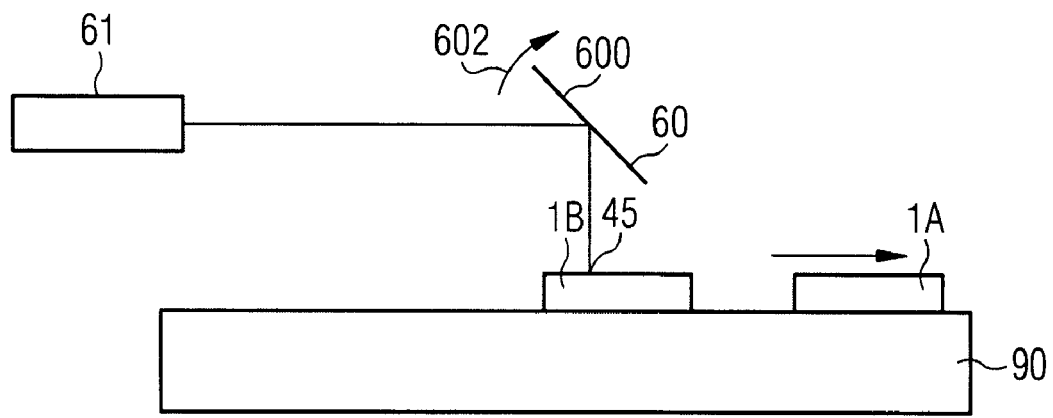

FIGS. 7A to 7C show an exemplary embodiment of the production method in which the optoelectronic module, during the production of the electrically conductive and/or thermally conductive connection of the contact conductor 25 to the connection area 30, is moved relative to the radiation source 61 of the coherent radiation and the radiation is tracked to the movement of the optoelectronic module.

Details of the method and of the optoelectronic module that were shown in the previous Figures are not shown explicitly in FIG. 7 unless they are essential for the tracking of the radiation or the movement of the optoelectronic module. FIGS. 7A to 7C in each case show a first optoelectronic module 1A and a second optoelectronic module 1B. In addition, a radiation source 61 is indicated, the coherent radiation 6 of which is deflected by means of a deflection optical unit 60. In FIG. 7A, the deflection optical unit 60 is situated in a starting position 600, so that the radiation generated by the radiation source impinges on the optoelectronic module 1A in a predetermined impingement region 45.

The coherent radiation 6 can be split into a plurality of partial beams as described in connection with FIG. 5, so that the radiation can also impinge simultaneously in a corresponding plurality of predetermined impingement regions on the optoelectronic module.

During the local heating of the optoelectronic module 1A in the impingement region 45, the optoelectronic module is moved in the direction of the arrow 605 by means of a conveyor device 90, for example a conveyor belt. In this case, the movement is effected preferably continuously and in particular at a constant speed.

As illustrated schematically in FIG. 7B, the radiation generated by the radiation source 61 is tracked to the movement of the optoelectronic module 1A by means of movement of the deflection optical unit 60 in the direction of the arrow 601 in such a way that the radiation 6, in step c), impinges on the optoelectronic module within the predetermined impingement region 45 despite movement of the optoelectronic module.

In FIG. 7C, the arrow 602 indicates that the deflection optical unit is returned to the starting position 600 in a further step of the method, so that the radiation is then directed onto the subsequent module 1B in an impingement region 45. After the deflection optical unit has returned to the starting position 600, therefore, the method described can be carried out for the subsequent module 1B.

Particularly preferably, the advance of the conveyor device 90 is adapted to the duration of the production of the electrically and/or thermally conductive connections of the respective contact conductors of the respective optoelectronic devices 2 of an optoelectronic module 1 to the respective connection areas of the connection carrier in such a way that in the time which elapses between the steps shown in FIGS. 7A to 7C, the optoelectronic module 1B is moved to a position at which the radiation is directed onto the predetermined impingement region 45 on the module 1B when the deflection optical unit is positioned in the starting position 600.

The movement of the optoelectronic modules during the production of an electrically conductive and/or thermally conductive contact in step c) of the method advantageously makes it possible to increase the throughput in the production of a multiplicity of optoelectronic modules. Stopping of the conveyor belt during the production of the electrically conductive and/or thermally conductive connections of the contact conductor to the connection area can advantageously be avoided.

The production of an electrically and/or thermally conductive connection in step c) of the method typically requires local heating for a time duration of only 2 s or less, preferably 500 ms or less, for example 200 ms. Particularly in the case of an optoelectronic module 1 which contains only a comparatively small number of optoelectronic devices 2, for example 100 optoelectronic devices or fewer, the production duration for an optoelectronic module can be significantly reduced in comparison with production in a reflow method.

Furthermore, it may be advantageous that the optoelectronic module 1 is only locally heated for the purpose of producing an electrically and/or thermally conductive connection of a contact conductor 25 to the associated connection area 30. Regions of the optoelectronic module which are at a distance from the impingement region 45 and, if appropriate, the impingement region 46 of the radiation are advantageously not heated directly by the coherent radiation 6 and are therefore heated only comparatively weakly in comparison with the predetermined impingement regions 45 and 46. This is advantageous in particular for optoelectronic devices 2 which are generally sensitive to heating. In particular, before producing an electrically and/or thermally conductive connection of the contact conductors 25 and 26 to the associated connection areas 30 and 31, respectively, of the connection carrier 3, an optical unit 80 can in each case be fixed to the optoelectronic devices 2 even though the melting point of the material of the optical unit lies below the melting point of the connecting means 5. The risk of damage to the optoelectronic device and in particular to the optical unit fixed thereto, for example on account of irreversible deformation caused thermally, can be reduced on account of the comparatively low heating of the optoelectronic device outside the predetermined impingement regions 45, 46.

The scope of protection of the invention is not limited to the examples given hereinabove. The invention is embodied in each novel characteristic and each combination of characteristics, which particularly includes every combination of any features which are stated in the claims, even if this feature or this combination of features is not explicitly stated in the claims or in the examples.

I claim:

1. An optoelectronic module comprising:
   at least one optoelectronic device with a housing body and a contact conductor; and
   a connection carrier with a connection area,
   wherein the contact conductor is electrically conductively and/or thermally conductively connected to the connection area by connecting means arranged between the contact conductor and the connection carrier, said connecting means containing a solder;
   wherein the optoelectronic device is arranged on a main side of the connection carrier;
   wherein the connection carrier has a cutout which is at least partly covered by the contact conductor and the connection means and which extends through the connection carrier; and
   wherein the optoelectronic device has a further contact conductor, wherein the contact conductor and the further contact conductor project from the housing body on opposite sides of the housing body.

2. The optoelectronic module as claimed in claim 1, wherein an optical unit is fixed to the optoelectronic device.

3. The optoelectronic module as claimed in claim 2, wherein the optical unit contains a plastic.

4. The optoelectronic module as claimed in claim 2, in which the optoelectronic device has a housing body, and wherein the optical unit is fixed to the housing body of the optoelectronic device and the optical unit extends beyond a lateral face delimiting the housing body.

5. The optoelectronic module as claimed in claim 1, further comprising an additional thermal contact conductor, which is formed on that side of the housing body which faces the connection carrier.

6. The optoelectronic module as claimed in claim 1, in which the contact conductor is formed on that side of the housing body which faces the connection carrier.

7. The optoelectronic module as claimed in claim 1, in which the optoelectronic module has at least one further optoelectronic device with a contact conductor.

8. The optoelectronic module as claimed in claim 7, in which the further optoelectronic device is formed in accordance with the optoelectronic device such that an optical unit is fixed to the further optoelectronic device.

9. The optoelectronic module as claimed in claim 7, further comprising two optoelectronic devices, which emit radiation in different color regions of the electromagnetic spectrum.

10. The optoelectronic module as claimed in claim 1, wherein the optoelectronic module is provided for backlighting a display device.

11. The optoelectronic module as claimed in claim 1, wherein the optoelectronic module is provided for backlighting an LCD.

12. The optoelectronic module as claimed in claim 1, wherein the cutout is completely covered by the contact conductor.

13. The optoelectronic module as claimed in claim 1, wherein the cutout is completely surrounded by the connection area on a main face of the connection carrier.

14. The optoelectronic module as claimed in claim 1, wherein a side of the optoelectronic device facing at least one of the connection carrier and a thermal contact conductor of the optoelectronic device is in complete contact with a side of the connection carrier facing the device.

15. A method for producing an optoelectronic module comprising at least one optoelectronic device with at least one contact conductor and a connection carrier with at least one connection area, wherein the method comprises the steps of:
   a) providing the connection carrier with the connection area;
   b) arranging the optoelectronic device on the connection carrier; and
   c) locally heating the optoelectronic module in a predetermined impingement region by means of coherent radiation,
   wherein, in step c), an electrically and/or thermally conductive connection is produced between the contact conductor and the connection area by conductive connecting means containing a solder;
   wherein the optoelectronic device is arranged on a main side of the connection carrier;
   wherein the connection carrier has a cutout which is at least partly covered by the contact conductor and the connection means and which extends through the connection carrier; and
   wherein in step c) the coherent radiation passes through the cutout of the connection carrier from a side of the connection carrier which is remote from the optoelectronic device.

16. The method for producing an optoelectronic module as claimed in claim 15, wherein, in step c), the optoelectronic module is moved relatively to a radiation source of the coherent radiation during the production of the electrically conductive and/or thermally conductive connection between the contact conductor and the connection area.

17. The method for producing an optoelectronic module as claimed in claim 16, wherein the coherent radiation is tracked to the movement of the optoelectronic module relative to the radiation source in such a way that the radiation impinges on the optoelectronic module within the predetermined impingement region for the heating.

18. The method for producing an optoelectronic module as claimed in claim 17, wherein, in step c), the radiation is directed onto the optoelectronic module by means of a movable deflection optical unit.

19. The method for producing an optoelectronic module as claimed in claim 18, wherein, in step c), the movable deflection optical unit is moved proceeding from a starting position for tracking the radiation, and the deflection optical unit is returned to the starting position after step c) in a step d).

20. The method for producing an optoelectronic module as claimed in claim 19, wherein, after step d), step c) is carried out for a further, separate optoelectronic module.

21. The method as claimed in claim 15, wherein the coherent radiation impinges on the predetermined impingement region for 2 s or less.

22. The method for producing an optoelectronic module as claimed in claim 15, wherein the coherent radiation is generated by means of a laser.

23. The method for producing an optoelectronic module as claimed in claim 15, wherein the connecting means is electrically conductive and/or thermally conductive.

24. The method for producing an optoelectronic module as claimed in claim 15, wherein the connecting means is a solder.

25. The method for producing an optoelectronic module as claimed in claim 15, wherein the electrically conductive and/or thermally conductive connecting means is applied to the connection carrier at least in regions before step c).

26. The method for producing an optoelectronic module as claimed in claim 15, wherein, in step c), the coherent radiation impinges on the contact conductor from that side of the contact conductor which is remote from the connection carrier, and the connecting means is heated through the contact conductor.

27. The method for producing an optoelectronic module as claimed in claim 15, wherein, in step c), a local, delimited heating region is formed on the contact conductor.

28. The method for producing an optoelectronic module as claimed in claim 15, wherein the coherent radiation is split into a plurality of partial beams by means of a beam-splitting assembly before impinging on the optoelectronic module.

29. The method for producing an optoelectronic module as claimed in claim 28, wherein a distance at which a partial beam and a further partial beam impinge on the optoelectronic module is set by moving the beam-splitting assembly along a beam path of the coherent radiation.

30. The method for producing an optoelectronic module as claimed in claim 29, wherein the optoelectronic module has a further impingement region at a predetermined distance from the impingement region, and the distance at which the partial beam and the further partial beam impinge on the optoelectronic module in step c) is set by means of movement of the beam-splitting assembly in such a way that the partial beam impinges on the optoelectronic module within the impingement region and the further partial beam impinges on said optoelectronic module within the further impingement region.

31. The method for producing an optoelectronic module as claimed in claim 30, wherein the optoelectronic module has a further contact conductor and a further connection area of the connection carrier, and wherein the further connection area is assigned to the further contact conductor.

32. The method for producing an optoelectronic module as claimed in claim 31, wherein, in step c), the contact conductor and the further contact conductor are electrically conductively and/or thermally conductively connected by means of the partial beam and the further partial beam, respectively, simultaneously to the connection area and further connection area, respectively.

33. The method for producing an optoelectronic module as claimed in claim 31, wherein, in step c), firstly the contact conductor and the further contact conductor of a first optoelectronic device of the at least one optoelectronic device are electrically conductively and/or thermally conductively connected to the respectively assigned connection area and further connection area and wherein step c) is subsequently repeated with respect to a second optoelectronic device of the same optoelectronic module.

34. The method for producing an optoelectronic module as claimed in claim 15, wherein the optoelectronic module comprises at least one further optoelectronic device with a contact conductor and the at least one further optoelectronic device is likewise arranged on the connection carrier in step b).

35. The method for producing an optoelectronic module as claimed in claim 15, wherein the optoelectronic device is pressed onto the connection carrier in step c).

36. The method for producing an optoelectronic module as claimed in claim 15, wherein, before step c), an optical unit is fixed to the optoelectronic device.

37. The method as claimed in claim 15, wherein the coherent radiation impinges the predetermined impingement region for 500 ms or less.

38. The method as claimed in claim 15, wherein the radiation for the soldering passes through the whole connection carrier.

* * * * *

UNITED STATES PATENT AND TRADEMARK OFFICE
CERTIFICATE OF CORRECTION

| | | |
|---|---|---|
| PATENT NO. | : 7,789,573 B2 | Page 1 of 1 |
| APPLICATION NO. | : 11/890944 | |
| DATED | : September 7, 2010 | |
| INVENTOR(S) | : Roland Rittner | |

It is certified that error appears in the above-identified patent and that said Letters Patent is hereby corrected as shown below:

Amend the Cover Sheet as follows:

(56) References Cited

FOREIGN PATENT DOCUMENTS

| | | |
|---|---|---|
| DE | 200 07 30 | 8/2009 |
| DE | ~~10 35 077~~ <u>103 35 077</u> | 3/2005 |
| DE | 10 2004 045 947 | 1/2006 |
| EP | 0 400 476 | 5/1990 |
| EP | 0 896 898 | 7/1998 |
| EP | 1 031 396 | 2/2000 |
| GB | 2 361 581 | 10/2001 |
| JP | 4-162641 | 6/1992 |
| JP | 2001-148403 | 5/2001 |
| WO | WO 2006/002603 A2 | 1/2006 |

Signed and Sealed this
Thirty-first Day of July, 2012

David J. Kappos
*Director of the United States Patent and Trademark Office*